(12) United States Patent
Jusuf et al.

(10) Patent No.: US 6,243,031 B1
(45) Date of Patent: *Jun. 5, 2001

(54) SELECTABLE DELAY CIRCUIT HAVING IMMUNITY TO VARIATIONS IN FABRICATION AND OPERATING CONDITION FOR WRITE PRECOMPENSATION IN A READ/WRITE CHANNEL

(75) Inventors: Gani Jusuf; Pantas Sutardja, both of San Jose, CA (US)

(73) Assignee: Marvell International Ltd., Hamilton (BM)

(*) Notice: Subject to any disclaimer, the term of this patent is extended or adjusted under 35 U.S.C. 154(b) by 0 days.

This patent is subject to a terminal disclaimer.

(21) Appl. No.: 09/528,659

(22) Filed: Mar. 20, 2000

Related U.S. Application Data

(63) Continuation of application No. 09/082,424, filed on May 20, 1998.

(51) Int. Cl.[7] .................................................. H03M 5/06
(52) U.S. Cl. .............................................. 341/68; 327/157
(58) Field of Search ................................. 341/68, 69, 72; 327/155, 157, 161

(56) References Cited

U.S. PATENT DOCUMENTS

| | | | |
|---|---|---|---|
| 4,623,805 | 11/1986 | Flora et al. | 327/152 |
| 5,159,205 | 10/1992 | Gorecki et al. | 327/150 |
| 5,642,068 | * 6/1997 | Wojcicki et al. | 327/172 |
| 5,777,567 | 7/1998 | Murata et al. | 341/100 |
| 6,133,861 | * 10/2000 | Jusuf et al. | 341/68 |

* cited by examiner

Primary Examiner—Peguy Jeanpierre
(74) Attorney, Agent, or Firm—Fenwick & West, LLP

(57) ABSTRACT

Precompensated NRZ-encoded data for writing to magnetic storage medium operates with multiple NRZI-to-NRZ decoders that are each supplied with a selectably-variable version of a master clock. The delayed versions of the master clock are stably produced by delay elements operating with D-flip flops and charge pumps in a delay-locked feedback loop. The direction of current supplied to or from a capacitor by the charge-pump during a cycle of delayed clock signal is controlled by the delayed clock signal for shaping the feedback signal to trigger appropriately the next cycle of the delayed clock signal. The duration of the selectable delay is adjusted by setting the amplitudes of the charge and discharge currents supplied by the charge-pump. Stable delayed versions of the master clock promote reliable conversions of NRZI data to write precompensated NRZ recordable data.

19 Claims, 9 Drawing Sheets

SELECTABLE DELAY CIRCUIT HAVING IMMUNITY TO VARIATIONS IN FABRICATION AND OPERATING CONDITION FOR WRITE PRECOMPENSATION IN A READ/WRITE CHANNEL

RELATED APPLICATION

This application is a continuation application entitled to priority from application Ser. No. 09/082,424, filed on may 20, 1998.

BACKGROUND

1. Field of the Invention

The present invention relates to circuits and methods for selectably delaying an input signal, and more particularly to such circuits and methods in which selected delay remains highly stable despite variations in fabrication, component matching, and operating temperature, and in which selectable delay facilitate write operations of consecutive data pulses to a magnetic storage medium in a manner that eliminates or reduces non-linear bit shifts.

2. Background of the Invention

Conventional magnetic storage devices typically read and write data onto one or more data tracks in a magnetic storage medium. In a conventional hard disk drive, for example, the data tracks are concentric rings on one or both surfaces of a hard disk or plurality of hard disks. To write data to a track, the disk is rotated at a determined rate of speed, and a magnetic read/write head floating over the track transforms electrical signals to magnetic transitions on the track.

Digital data is thus stored on conventional magnetic storage devices by encoding such data as the presence and absence of magnetic transitions or pulses. A pulse can represent a bit value of ONE, and the absence of a pulse can represent a ZERO. In another conventional technique (referred to Non-Return to Zero Inverted (NRZI) coding), a bit value of ONE is represented by a change or transition in magnetization orientation, and a bit value of ZERO is represented by the absence of such change or transition. Thus, in NRZI coding, a string of three ONES is represented by a storage pulse, followed by absence of a storage pulse, followed by a storage pulse.

Each storage pulse magnetizes a small magnetic domain on a track, and the magnetic intensity of such a stored pulse is typically wedge shaped with higher intensity at the center of the small domain than near the leading and trailing edges thereof. Locations of magnetic pulses and locations of absent pulses typically are positioned in very close proximity in each track. This can create storage errors if adjacent stored pulses overlap, and the data significance of overlapping stored pulses can be difficult to interpret. Two consecutively stored magnetic pulses can be misread as a single stored pulse. This effect is commonly referred to as intersymbol interference, and can account for a much higher percentage of total data storage errors than noise. Recording high densities of data on a magnetic medium can also result in data distortion due to pulse compression, pulse-edge displacement and non-linearities of the storage device.

One approach for reducing such known problems is to spread immediately sequential magnetic pulses over a slightly larger length of track. This produces a small gap between the sequential pulses, and thus reduces intersymbol interference. The gap commonly used typically has a length that is shorter than the increment of track that represents absence of a stored pulse. Consequently, the gap can be distinguished from such absence. This conventional approach to reducing intersymbol interference is commonly called write precompensation.

Conventional write precompensation circuits and methods commonly determine write precompensation delays as integral numbers of clock cycles. Such circuits and methods require very high frequency clocking of components to provide appropriate write precompensation delays of very short duration. Other conventional circuits and methods require resistor and capacitor (RC) circuits to determine write precompensation delays. Such RC circuits tend to perform poorly because resistors and capacitors having sufficiently fine tolerances to provide accurate delays are difficult to fabricate, and the duration of delay provided by such RC circuits is thus typically not precisely defined. Further, the duration of delay provided by such RC circuits is often susceptible to variations in the operating temperature thereof.

SUMMARY OF THE INVENTION

In accordance with the present invention, high performance circuits and methods provide selectable delay of input signals, using a feedback loop to stabilize the duration of the delay provided. Each feedback loop receives a delay control signal for adjusting the duration of such delay over a range of values that can increase up to about ninety percent of the clock interval.

Specifically, a delay-locked loop generates an accurate delay of the master clock. A delay element converts the master clock to a controlled duty cycle clock that has one fixed clock edge and another trailing edge that is varied in time in response to programming control by as much as 90% of the master clock interval. The delayed clock edge provides the delayed reference clock to convert input NRZI data into delayed Non-Return to Zero (NRZ) data. The output of a first one of a plurality of identical delay elements serves as a reference, and the outputs of the remaining delay elements are variously delayed relative to the reference. Thus, an NRZ pattern of varied delays relative to the reference NRZ pattern is generated, and a control circuit selects the appropriate delayed NRZ data in accordance with past history of supplied NRZI data. In accordance with one embodiment of the invention, any one of four such delay elements is selected in response to at least two prior or previous intervals of NRZI data. Thus, the appropriate delayed NRZ data is selected via a multiplexer that is controlled in response to the NRZI data states in each of two prior delayed intervals. The requisite control circuits and delay elements thus function with high accuracy and substantial immunity from fabrication variations.

The delay elements according to one embodiment of the present invention each includes a detector, a charge-pump, and a capacitor connected in a feedback loop, with the detector generating the delayed clock signal in response to the state of the clock signal and an average voltage across the capacitor. The state of the delayed clock signal controls the direction of current supplied to the capacitor by the charge-pump and the amplitude of this current is controlled by the delay control signal. The charge-pump periodically charges and discharges the capacitor to produce a periodic time-varying voltage thereacross. The average value of this time-varying voltage determines duration of the delayed clock signal. For each delay element, the capacitor is repetitively charged and discharged in each cycle of the master clock signal to ensure settling to steady-state operating conditions when locked onto the selected duration of delay.

The high performance circuit of the present invention provides write precompensation for an input signal to be stored as NRZ encoded data. This high performance circuit compensates for various non-linearities in the storage device and storage process, and the durations of delays are selectable to avoid intersymbol interference.

DETAILED DESCRIPTION OF THE INVENTION

For purposes of describing the present invention, various terms used herein are first defined. The various embodiments of the present invention are described as operating between a high voltage (referenced as $V_{DD}$) and a ground voltage (referenced as $V_{SS}$). The HIGH state of a signal is defined as that portion of the signal which is at, or is substantially at, the high voltage $V_{DD}$. Similarly, the LOW state of a signal is defined as that portion of the signal which is at, or is substantially at, the low voltage $V_{SS}$. The duty cycle of a clock signal is defined as the percentage of time that the clock signal is in the HIGH state.

Figure 1:
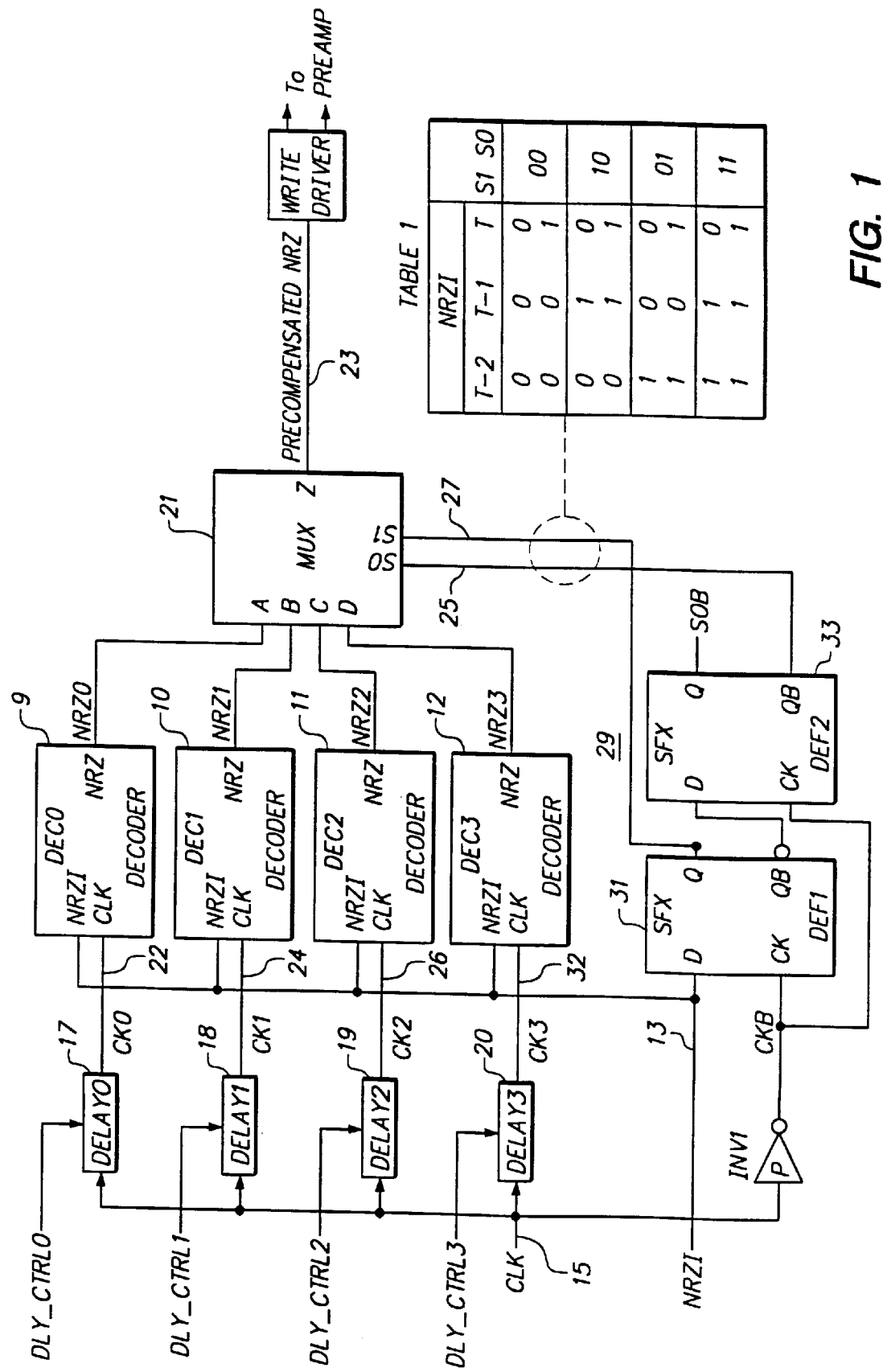
FIG. 1 is a block schematic diagram of one embodiment of a write precompensation circuit according to the present invention.

Referring now to the block schematic diagram of FIG. 1, there is shown a plurality of decoders 9–12 for converting NRZI data to NRZ data, for example, for writing to a magnetic recording medium, such as a magnetic hard disk. Each decoder 9–12 receives the applied NRZI data 13 and a delayed version 22, 24, 26, 32 of the master clock 15 via the delay networks 17–20 which are each separately controlled, as later described herein. Multiplexer 21 is connected to receive the NRZ converted outputs to produce therefrom the precompensated NRZ data signals 23 for recording on magnetic storage medium in response to the control signals 25, 27 that are applied to the multiplexer 21 from control circuit 29. The control circuit 29 includes a pair of D-flip flops 31, 33 that each receive an inverted version of the master clock 15. The NRZI data to be converted and recorded is supplied to the D input of the first D-flip flop 31, the Q output of which supplies the SI control signal to multiplexer 21 on line 27. The D input of the second D-flip flop 33 is coupled to receive the Q output of the first D-flip flop 31 to supply the control signal So to multiplexer 21 on line 25 from the Q output of the second D-flip flop 33.

In operation, the control signals $S_0$ and $S_1$ are supplied on lines 25, 27 to the multiplexer 21 in accordance with the prior states of the NRZI data, as set forth in TABLE 1. Thus, the State of NRZI data of a first prior time interval (T-1), and at a second prior time interval (T-2) determines the states of $S_0$ and $S_1$ to implement conversion to NRZ data, as illustrated by the waveforms of FIG. 2.

Figure 2:
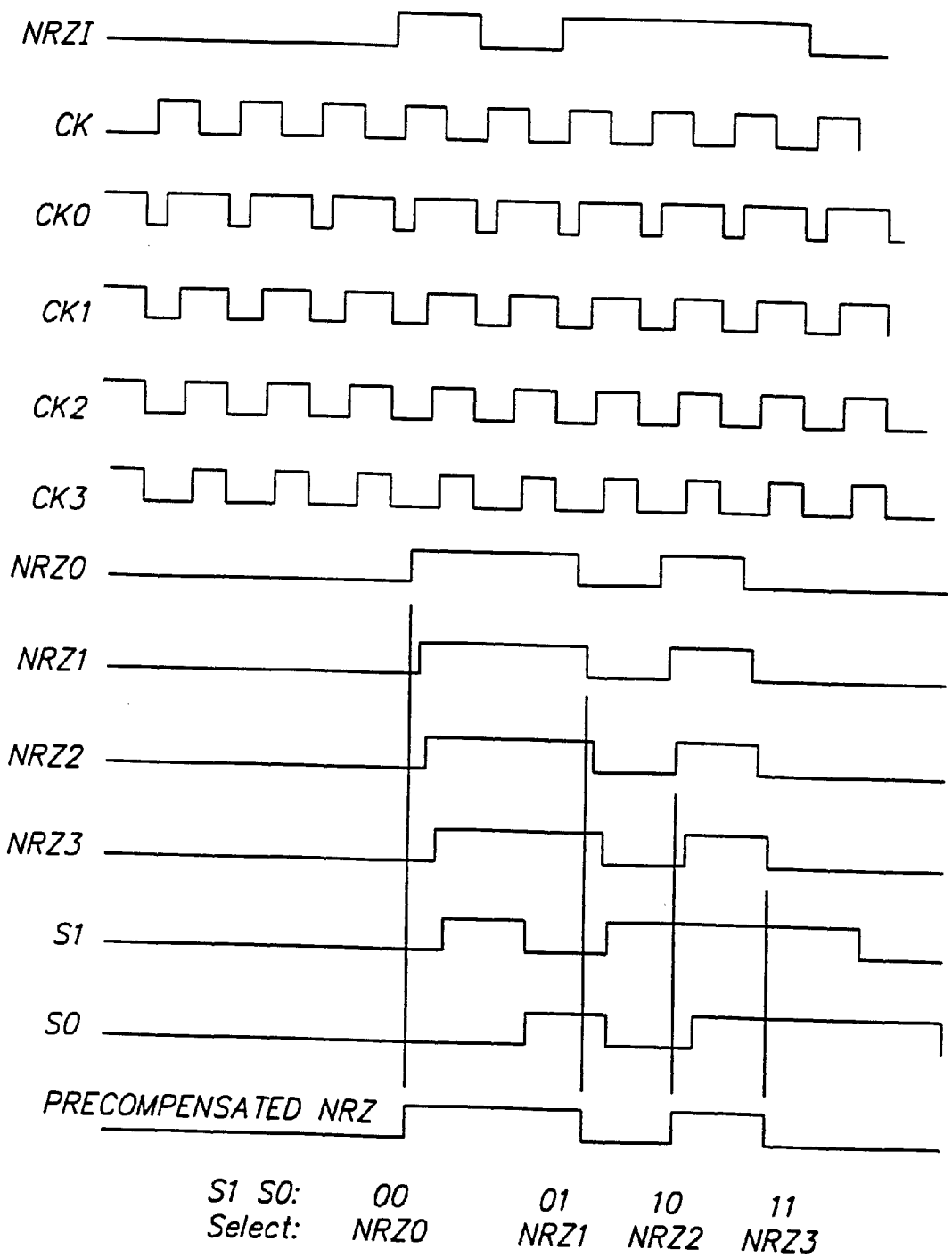
FIG. 2 is a graph illustrating operational waveforms in the circuit of FIG. 1.

As illustrated in FIG. 2, typical time-varying NRZI data is synchronized with the master clock (ck), and each of the delayed clocks ($ck_0 \ldots ck_3$) has a leading edge that is referenced by a fixed delay relative to the master clock ck. However, the trailing edges of each of the delayed clocks $ck_0 \ldots ck_3$ is incrementally delays relative to the leading edge (by up to about 90% of the master clock interval) in response to the individual DLY_CTRL control signals supplied to each of the delay networks 17–20 in the circuit of FIG. 1. Therefore, the $NRZ_0 \ldots NRZ_3$ decoded data at the outputs of each of the decoders 9–12 is successively delayed, in the manner as shown in FIG. 2. The $S_0$ and $S_1$ control signals to the multiplexer 21 that receives each of the $NRZ_0 \ldots NRZ_3$ signals are as illustrated in FIG. 2 and in TABLE 1 to produce the precompensated NRZ data signals 23 according to the illustrated selections in response to the states of the $S_0$ and $S_1$ control signals.

Figure 3A:
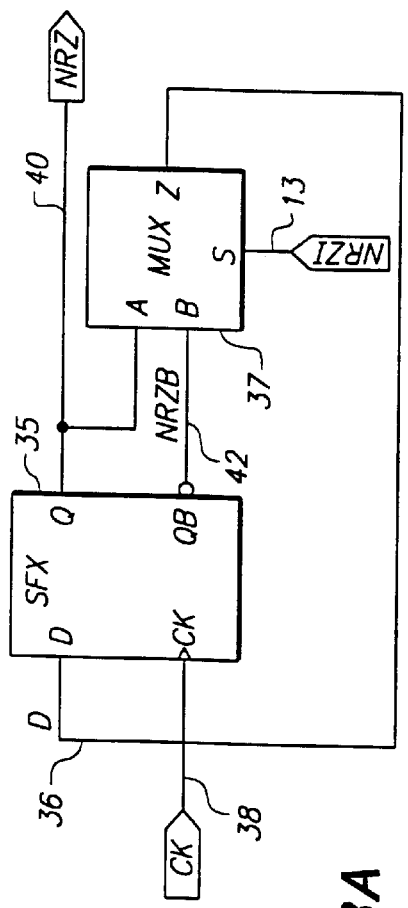
FIG. 3A is block schematic diagram of a NRZI-to-NRZ decoder according to the present invention.

Referring now to the block schematic diagram of FIG. 3A, there is shown the circuitry of each decoder 9–12 of FIG. 1 that includes a D-flip flop 35 having Q and $\overline{Q}$ outputs connected to a multiplexer 37. Specifically, the clock input of the D-flip flop 35 receives the delayed clock $ck_0 \ldots ck_3$ from an associated delay network 17–20, and the D input receives the output of the multiplexer 37 which is switched between inputs A and B in response to the data states of the applied NRZI signal 13. The Q output of D-flip flop 35 is applied to one input (B) of the multiplexer 37, and the $\overline{Q}$ output of the D-flip flop 35 is applied to the other input (A) of the multiplexer 37, and is the converted NRZ data.

Figure 3B:
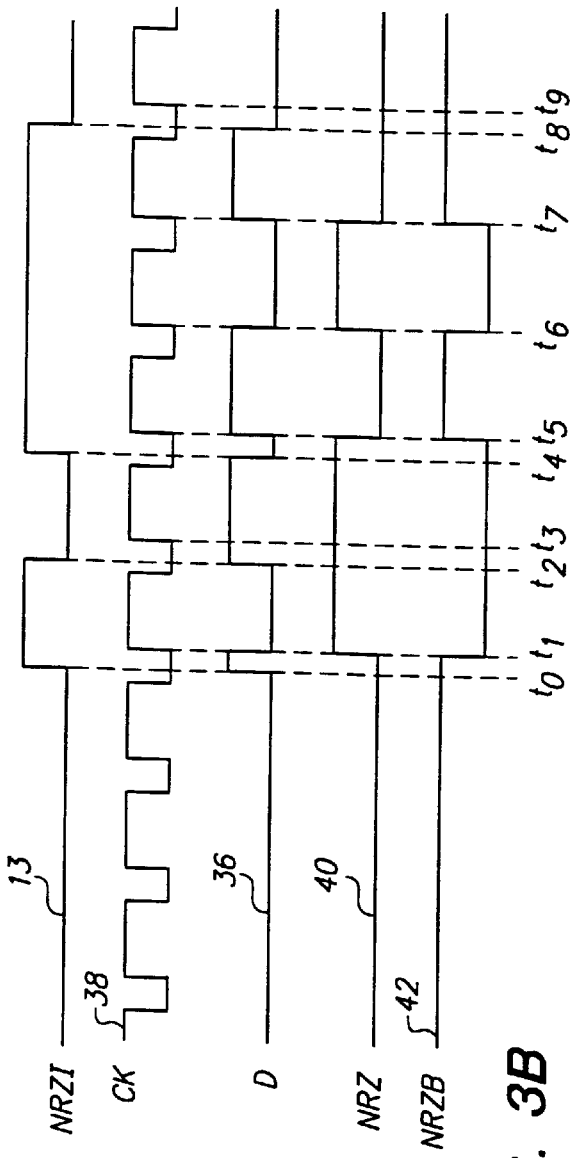
FIG. 3B is a graph showing operational waveforms in the circuit of FIG. 3A.

In the operation of the circuit of FIG. 3A, as shown by the wave forms of FIG. 3B, the NRZI signal 13 data is assumed initially to be LOW and the resulting NRZ output signal 40 is also LOW. Moreover, it is assumed for illustration that all the elements have no delay. Then:

At t0: NRZI signal 13 goes HIGH resulting in D signal 36 going HIGH.

At t1: CK signal 38 goes from LOW to HIGH, making NRZ signal 40 go from LOW to HIGH and NRZB 42 signal go from HIGH to LOW. Since NRZI signal 13 is HIGH, input B 42 of multiplexer 37 is selected, sending D signal 36 from HIGH to LOW.

At t2: NRZI signal 13 changes from HIGH to LOW selecting input A 40 of multiplexer 37. Since NRZ signal 40 is still HIGH, D signal 36 therefore changes from LOW to HIGH.

At t3: CK 38 goes HIGH, NRZ signal 40 doesn't change i.e. stays at HIGH state.

At t4: NRZI signal 13 changes from LOW to HIGH selecting input B 42 of multiplexer 37. D signal 36 changes from HIGH to LOW.

At t5: CK signal 38 goes from LOW to HIGH making NRZ signal 40 go from HIGH to LOW and NRZB signal 42 go from LOW to HIGH. Since NRZI 13 signal is HIGH, input B 42 of multiplexer 37 is selected, sending D signal 36 from LOW to HIGH.

At t6: CK signal 38 goes from LOW to HIGH making NRZ signal 40 go from LOW to HIGH and NRZB signal 42 go from HIGH to LOW. Since NRZI signal 13 is HIGH, input B 42 of multiplexer 37 is selected, sending D signal 36 from HIGH to LOW.

At t7: CK signal 38 goes from LOW to HIGH making NRZ signal 40 go from HIGH to LOW and NRZB signal 42 go from LOW to HIGH. Since NRZI signal 13 is HIGH, input B 42 of multiplexer 37 is selected, sending D signal 36 to go from LOW to HIGH.

At t8: NRZI signal 13 changes from HIGH to LOW selecting input A of multiplexer 37. Since NRZ signal 40 is LOW, D signal 36 therefore changes from HIGH to LOW.

At t9: CK 38 goes HIGH, NRZ signal 40 doesn't change i.e. stays at LOW state.

Figure 4:
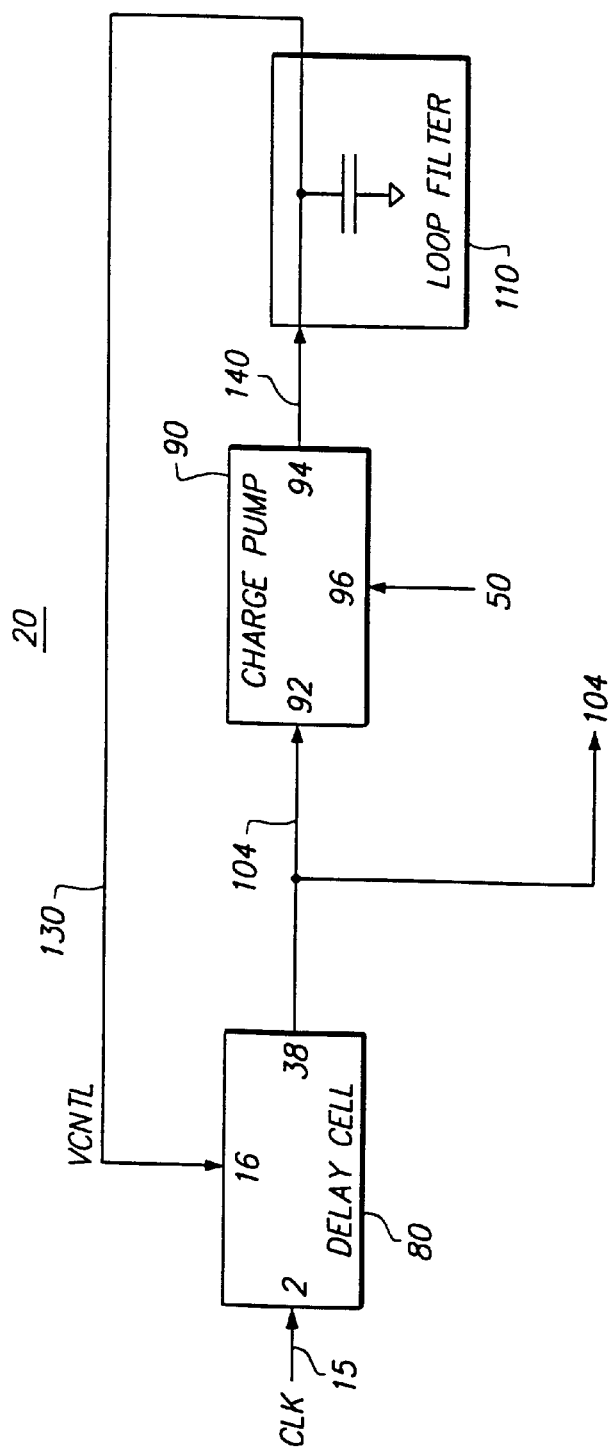
FIG. 4 is a block diagram of a delay element in accordance with one embodiment of the present invention.

Referring now to FIG. 4, there is shown a block diagram of one embodiment of the delay elements 17–20 according to the present invention. Delay element 20 is a delay-locked loop that generates an accurate delay of the master clock. Delay element 20 comprises a delay circuit called a delay cell 80, a single-sided controlled charge pump 90 driving a loop filter capacitor 110 that are connected for operation in a feedback loop, as follows.

The delay cell 80 is coupled to receive the clock 15, and the control port 16 receives a feedback signal via line 130 from capacitor 110. In response to an increased average voltage of the feedback signal on line 130, the delay cell 80 decreases the delay of the rising edge of the applied clock signal 15, effectively increasing the duty cycle of the delayed clock 104. Similarly, in response to a decreased average voltage of the feedback signal on line 130, the delay cell 80 increases the delay of the rising edge of the applied clock signal 15, effectively decreasing the duty cycle of the delayed clock 104. The resultant delayed clock signal on line 104 serves both as an output signal of the delay element 20, and as an input signal to the charge-pump 90 that is coupled to capacitor 110.

Figure 5:
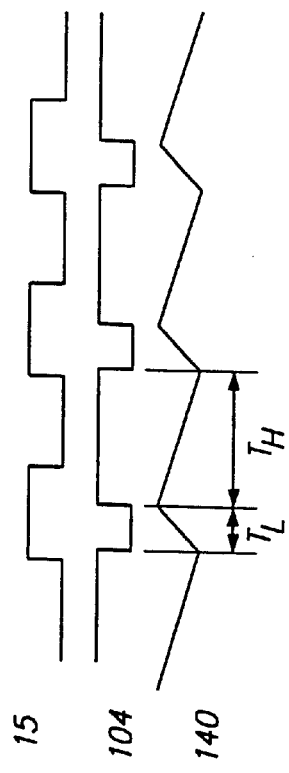
FIG. 5 is a graph showing operational waveforms in the circuit of FIG. 4.

The delay cell 80 thus supplies delayed clock signals on line 104 in response to the state of the clock signal 15 and the average voltage of the feedback signal on line 130. In particular, the delayed clock signal 104 has falling edges that fall immediately after corresponding rising edges of the clock signal as shown in FIG. 5. However, the delayed clock signal 104 has rising edges delayed with respect to corresponding rising edges of the clock signal 15, with the duration of such delay being controlled by the average voltage of the feedback signal on line 130. The duration of delay of rising edges of the delayed clock signal on line 104 may equal the duration $T_L$ of the LOW state of the delayed clock signal.

The charge-pump 90 has an input port 92 that receives the delayed clock signal on line 104 from the delay cell 80. The control port 96 receives the delay control signal 50 which controls the amount of charging or discharging current into and out of the capacitor 110. The output port 94 is coupled via line 140 to the capacitor 110 that is referenced to the electrical ground ($V_{SS}$).

The charge-pump 90 supplies current directed alternately into and out of the capacitor 110 during each cycle of the delayed clock signal 104 to produce a saw-tooth voltage across the capacitor 110, as shown in FIG. 5. The state of the delayed clock signal determines the direction of current flow in line 140. In particular, the charge-pump 90 supplies charging current $I_{CHARGE}$ to the capacitor 110 during the duration $T_L$ of the LOW state of the delayed clock signal on line 104, and draws discharging current $I_{DISCHARGE}$ from the capacitor during the duration $T_H$ of the HIGH state of the delayed clock signal on line 104. The resulting time-varying voltage across the capacitor 110, is supplied via line 130 to the control port 16 of the delay cell 80 as the feedback signal.

The combined operation of the delay cell 80, charge-pump 90, and capacitor 110 has an equilibrium state of operation in which the duration $T_L$ of the LOW state of the delayed clock signal equals the selected duration $T_D$ of delay specified by the delay control signal 50. In particular, if $T_L = T_D$, then the total charge $I_{CHARGE} \times T_L$ supplied to the capacitor 110 equals the total charge $I_{DISCHARGE} \times T_H$ drawn from the capacitor 110 during each cycle of the delayed clock signal 104. Consequently, the charge-pump 90 repeats substantially the same charging and discharging operations during each delayed clock cycle, and the delay element 20 is thus in stable equilibrium producing a periodic, time-varying voltage on line 130 during steady-state operation.

Thus, control signal 50 sets the amount of charging/discharging current by charge-pump 90 into and out of the capacitor 110. The average voltage 130 generated across capacitor 110 is then used to control the delay cell 80 to generate a delay clock 104 that has a corresponding duty cycle to 'lock' the loop. By programming charge pump 90 via control signal 50, the duty cycle of delayed clock 104 can be varied accordingly.

It should be noted that if $T_L$ becomes less than $T_D$ during operation of the delay element 20, then the capacitor 110 will be discharged more than it is charged during a cycle of the delayed clock signal 104. The voltage across the capacitor 110 consequently decreases, which reduces the average voltage of the feedback signal on line 130. This in turn increases delay in the delay cell 80, causing $T_L$ to increase toward $T_D$. Similarly, if TL becomes greater than $T_D$, then the voltage across the capacitor 110 increases, which increases the average voltage of the feedback signal on line 130 that decreases delay in delay cell 80, causing $T_L$ to decrease toward $T_D$. After multiple cycles of the delayed clock signal on line 104, the equilibrium state at which $T_L = T_D$ is reestablished, and thus this equilibrium state is stable.

The duration $T_L$ of the delay of rising edges of the delayed clock signal 104 can be changed by appropriately controlling the amplitudes of both the charging current $I_{CHARGE}$ and the discharging current $T_{DISCHARGE}$. To increase the selected duration $T_D$ of the delay, the amplitude of the charging current $I_{CHARGE}$ is appropriately decreased, and the amplitude of the discharging current $I_{DISCHARGE}$ is appropriately increased. After a plurality of clock cycles, the delay element 20 reestablishes equilibrium in which $T_L$ equals the newly selected value for $T_D$. Similarly, to decrease the duration $T_L$ of delay of rising edges of the delayed clock signal 104, the amplitude of the charging current $I_{CHARGE}$ is appropriately increased, and the amplitude of the discharging current $I_{DISCHARGE}$ is appropriately decreased. This analysis is applicable even if $T_L$ and $T_D$ are initially widely different, and thus achieving equilibrium is assured.

Figure 6A:
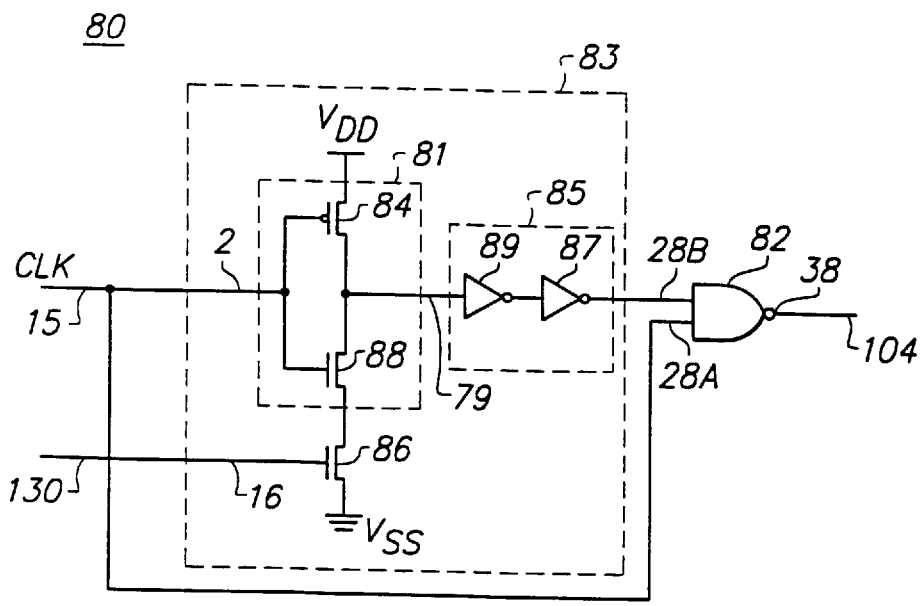
FIG. 6A is a schematic diagram of one embodiment of a delay cell for inclusion in a delay element of FIG. 4.

Referring now to FIG. 6A, there is shown one embodiment of the delay cell 80 that includes an inverter chain 83 and a NAND gate 82. The inverter chain 83 comprises a plurality of n-channel field effect transistors (NFETs) 86, 88 and a p-channel field effect transistor (PFET) 84 with the channels thereof serially connected between supply voltage $V_{DD}$ and ground ($V_{SS}$). The PFET 84 and NFET 88 are coupled together in conventional manner to form an inverter 81 having an input 2 that receives the clock signal 15, and the gate of NFET 86 is the feedback control port 16 that receives the feedback signal on line 130 from capacitor 110, as previously described with reference to FIGS. 4 and 5.

Figure 6B:
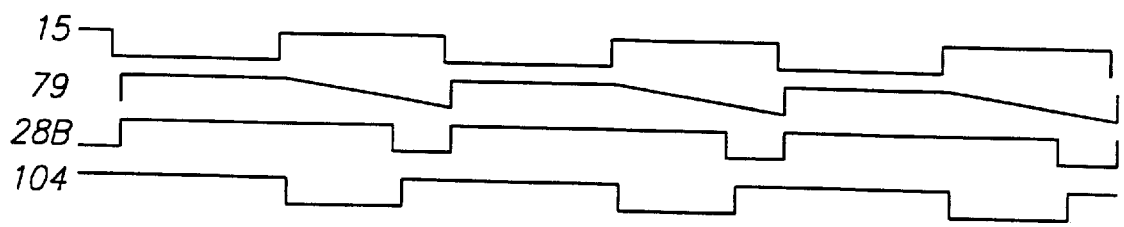
FIG. 6B is a graph illustrating operational waveforms in the delay cell of FIG. 6A.

The inverter 81 supplies an inverted clock signal 79 having rising edges in rapid transition and falling edges in gradual transition, as shown in FIG. 6B. The rapidly rising edges each rise very shortly after a corresponding falling edge of the clock signal 15, and the gradually falling edges each occur shortly after a corresponding rising edge of the clock signal 15. The time taken for a gradually falling edge to fall determines part of the total delay provided by the delay cell 83, and is determined by the level of current in NFET 88. This current level is controlled by the NFET 86 which essentially acts as a voltage-controlled variable resistance controlled by the feedback signal on line 130 from the capacitor 110. Decreasing the average voltage of the feedback signal on line 130 increases the variable resistance of the NFET 86 which increases the time taken for each gradually falling edge to fall. Similarly, increasing the average value of the feedback signal on line 130 decreases the variable resistance of NFET 86 which reduces the time taken for each gradually falling edge to fall.

The output 79 of the inverter 81 is coupled to buffer 85 that comprises a cascaded pair of conventional Complementary Metal Oxide Semiconductor (CMOS) inverters 89, 87 that produce a buffered inverted clock signal at gate input 28B having rapidly rising and rapidly falling edges. The total delay of the buffered inverted clock signal is determined by the combined delay of the cascaded inverters 81, 85.

The NAND gate 82 is connected to receive the buffered inverted clock signal from the chain inverter 83 and the clock signal 15 to provide the delayed clock output on line 104 at the output port 38 of the detector 80. The NAND gate 82 assures that falling edges of the delayed clock signal 104 are generated immediately after rising edges of the clock signal 15, and also assures that rising edges of the delayed clock signal 104 are generated immediately after falling edges of the buffered inverted clock signal at NAND gate input 28B. The rising edges of the delayed clock signal 104 are thus delayed by substantially the same duration that the falling edges of the buffered inverted clock signal are delayed. The delay is controlled by the average voltage of the feedback signal on line 130, with increased average voltage thereof reducing the duration of this delay.

The duration of delay of rising edges of the delayed clock signal available from the delay cell 80 on line 104 is limited by the duration of the HIGH state of the clock signal 15. For example, if clock signal has a 50% duty cycle, then the duration of this delay is limited to about 50% of the clock period, and in practical implementations may be limited to less than 50% of the clock period. The timing diagram of FIG. 6B illustrates the relative states of the clock signal 15, the inverted clock signal 79, the buffered inverted clock signal at NAND gate input 28B, and the delayed clock signal 104 during operation of the detector 80.

Figure 6C:
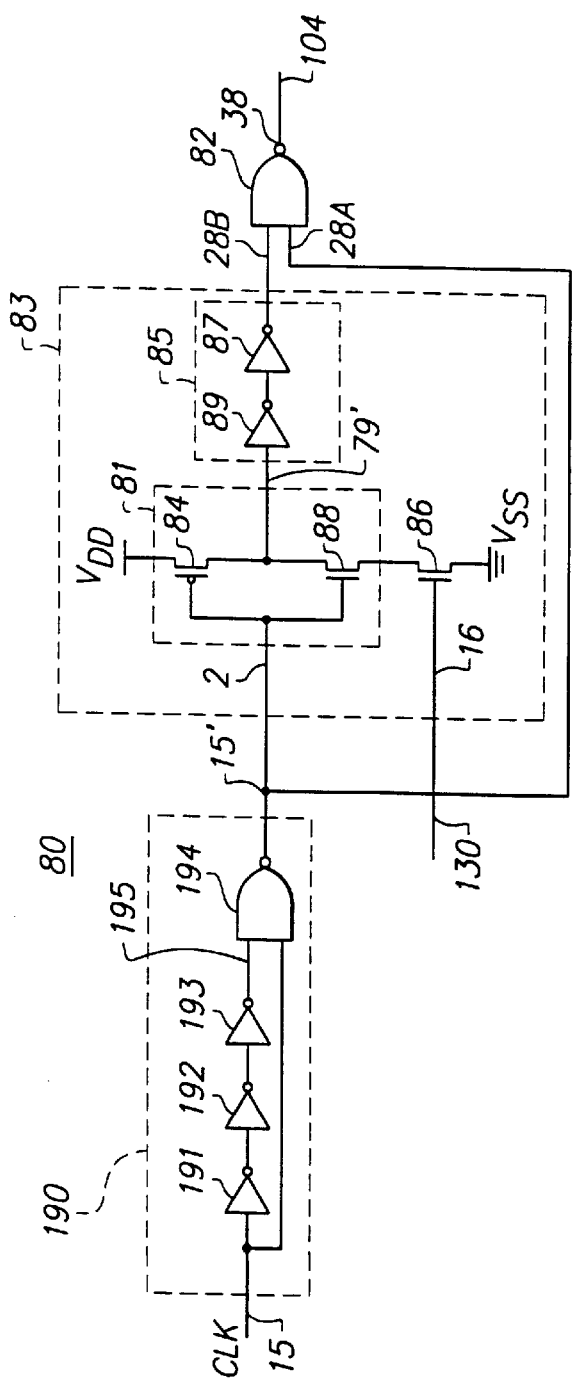
FIG. 6C is a schematic diagram of another embodiment of a delay cell for inclusion in a delay element of FIG. 4.

Referring now to FIG. 6C, there is shown another embodiment of the delay cell 80 as previously described with reference to FIG. 6A, including a predriver 190 which includes three cascaded inverters 191–193 and a NAND gate 194 that is connected to receive the clock 15 and a triply-inverted clock 195. The predriver 190 supplies to the input port 2 of the inverter chain a modified clock signal 15' having a larger duty cycle. Because the duty cycle of the modified clock signal 15' can be larger than the duty cycle of the clock signal 15, this embodiment of the delay cell 80 can provide delays of longer duration without having to alter the clock signal 15 to attain longer delays.

Figure 6D:
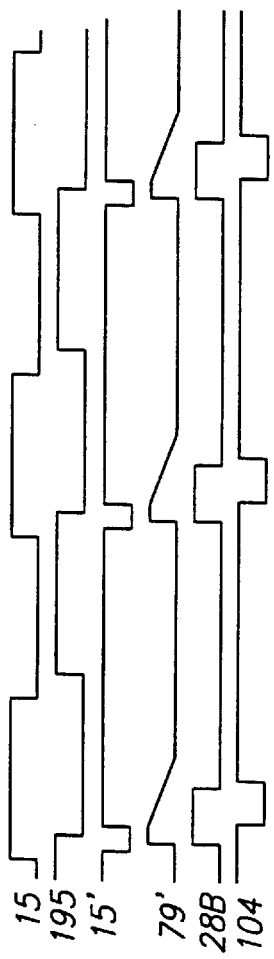
FIG. 6D is a graph illustrating operational waveforms in the delay cell of FIG. 6C.

With reference to the operating waveforms, as illustrated in FIG. 6D, it should be noted that the triply-inverted clock signal 15' is LOW when the clock signal 15 is HIGH. Consequently, the modified clock signal 15' supplied by the NAND gate 194 is in the HIGH state a majority of the clock cycle. However, when the clock signal 15 switches from the LOW state to the HIGH state, the triply-inverted clock signal 195 briefly remains in the HIGH state (due to the combined delay times of the three inverters 191, 192, 193). Because both inputs 195 and 15 of the NAND gate 194 are briefly at the HIGH state, the modified clock signal 15' briefly goes into the LOW state. Thus, the predriver 190 supplies the modified clock signal 15' having a very brief LOW state and a very long HIGH state for producing a delayed clock signal 104 of more widely adjustable duty cycle.

Figure 7A:
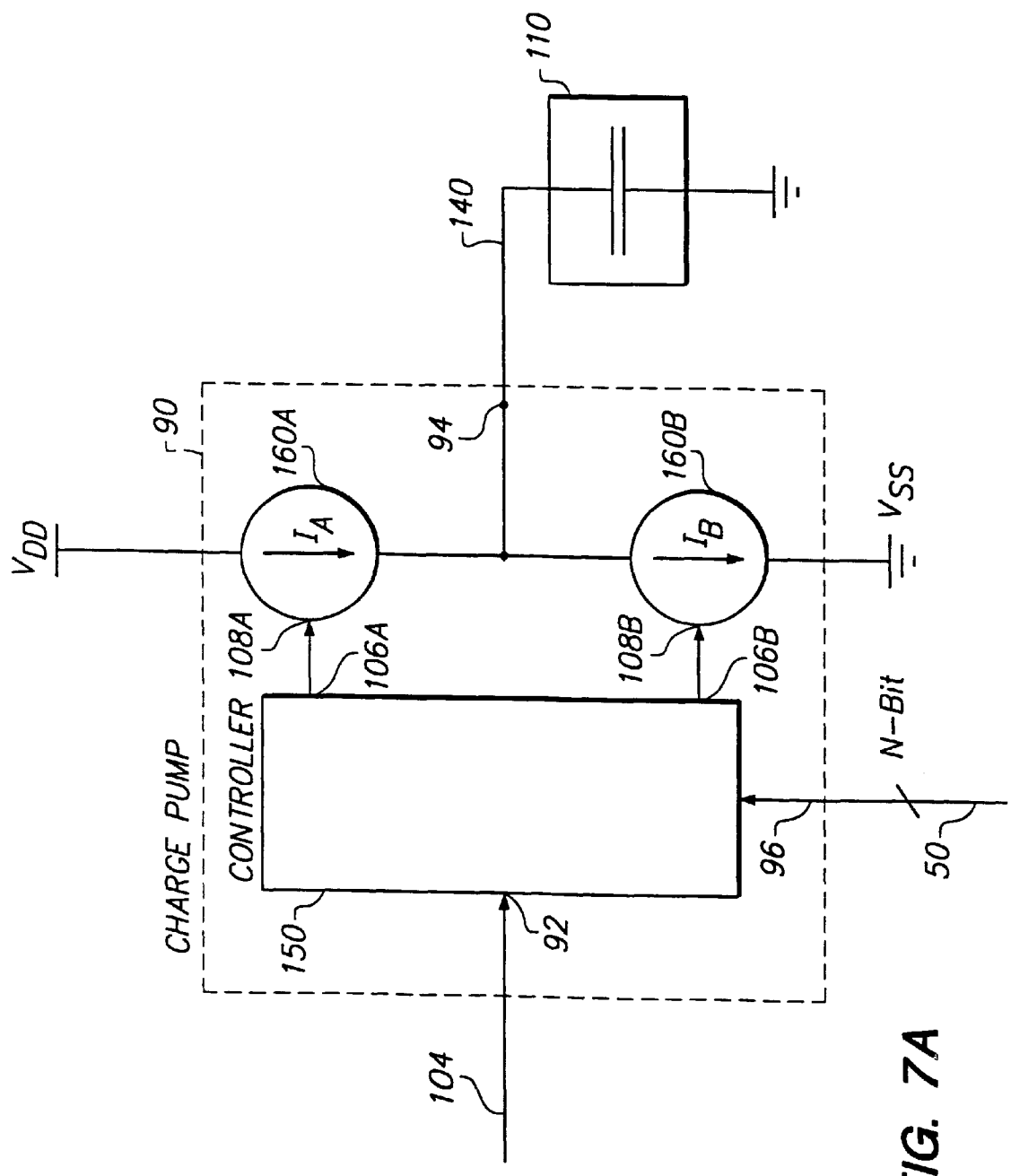
FIG. 7A is a partial schematic diagram of one embodiment of a charge-pump for inclusion in a delay element of FIG. 4.

Referring now to FIG. 7A, there is shown a partial schematic diagram of one embodiment of the charge-pump 90 in the circuit of FIG. 4 which includes current sources 160A, 160B that are adjusted by controller 150. The current source 160A supplies current to charge the capacitor 110 and the current source 160B draws current to discharge the capacitor 110 that is connected to the common junction of the current sources 160A, 160B which are serially connected between the high supply voltage $V_{DD}$ and ground ($V_{SS}$). Input 92 of the controller 150 is coupled to receive the delayed clock on line 104 and control input 96 is coupled to receive the delay control signal on line 50. The outputs 106A, 106B of the controller 150 are coupled to control ports 108A, 108B of the current sources 160A, 160B for controlling the amplitudes of currents $I_A$, $I_B$.

In operation, the controller 150 controls the amplitude of current $I_A$ supplied by current source 160A (which is always turned ON) in relation to a duration $T_D$ specified by the delay control signal 50, and the controller 150 controls the amplitude of current $I_B$ drawn by current source 160B in response to the state of the delayed clock signal. Thus, current $I_B$ is either fully ON or fully OFF.

During the duration $T_L$ of the LOW state of the delayed clock signal 104, the controller 150 turns OFF the current source 160B, and the current $I_A$ supplied by current source 160A charges the capacitor 110.

During the duration $T_H$ of the HIGH state of the delayed clock signal 104, the controller 150 turns ON current source 160B and, with both current sources 160A, 160B turned ON, the current source 160B draws both the current IA supplied by current source 160A and discharging current $I_{DISCHARGE}$ from the capacitor 110 in the relationship:

$$I_{DISCHARGE} = I_B - I_A. \tag{Eq. 1}$$

The controller 150 determines the amplitude for the current $I_A$ in relation to the delay control signal 50 that is an N-bit number, Y, where 0<Y<1, which determines the duty cycle of the delayed clock signal 104 as a percentage of the period T of the clock signal. The duty cycle of the delayed clock signal 104 is defined to be $T_H/T=Y$ or $(1-T_L)/T=Y$ where $T=T_L+T_D$. More particularly, TD therefore is given by:

$$T_D = (1-(Y \times I_a/I_b)) \times T; \tag{Eq. 2}$$

where $I_a$ and $I_b$ are maximum currents supplied or drawn by the current sources 160A and 160B.

The controller 150 controls the current sources 160A, 160B according to the following relationships:

1) At all times, the controller 150 controls the current source 160A to supply current $I_A$ at the amplitude $I_A=Y\times I_a$. This current $1_A$ charges the capacitor 110 during the LOW state of the delayed clock signal 104; and.

2) During the HIGH state of delayed clock signal, the controller 150 controls the current source 160B to draw current $I_B$ at the amplitude $I_B=I_b$. A portion of this current discharges the capacitor 110, and the remainder is drawn from current source 160A.

Over a plurality of cycles of the clock signal 15, these relationships cause the delay cell 20 and charge pump 90 of FIG. 4 to approach an equilibrium state of operation in which the duration $T_L$ of the LOW state of the delayed clock signal equals the selected duration $T_D$ specified by the delay control signal 50. This is demonstrated in two steps, as follows:

First, when $T_L=T_D$, relationships 1) and 2), above, maintain the total charge $I_A\times T$ supplied by current source 160A equal to the total charge $I_B\times T_H$ drawn by current source 160B during each cycle of the delayed clock signal. This equality is demonstrated, as follows:

From Eq. 2 above, $T_D=(1-(Y\times I_a/I_b))\times T$. Therefore:

$$I_b\times T_D=(I_b-(Y\times I_a))\times T;\qquad (Eq.\ 3)$$

$$I_B\times T_D=(I_B-I_A)\times T;\qquad (Eq.\ 4)$$

and $$I_A\times T=I_B\times(T-T_D).\qquad (Eq.\ 5)$$

Using the relationship $T_D=T_L$ thus yields:

$$I_A\times T=I_B\times(T-T_L);\qquad (Eq.\ 6)$$

and thus $$I_A\times T=I_B\times T_H.\qquad (Eq.\ 7)$$

The average voltage across the capacitor 110, and hence the average voltage of the feedback signal on line 130, from cycle to cycle is thus substantially constant when $T_L=T_D$.

Also, the combined operation of the charge-pump 90, capacitor 110, and delay cell 80, as described above with reference to FIG. 4, causes the duration $T_L$ of the LOW state of the delayed clock signal 104 to move toward the selected duration $T_D$ of delay specified by the delay control signal 50. In response to the duration $T_L$ being less than the selected duration $T_D$, the current source 160B is turned ON for more than $T-T_D$. Consequently, the total charge $I_A\times T$ supplied to capacitor 110 by current source 160A will be less than the total charge drawn from the capacitor 110 by the current source 160B during a cycle of the delayed clock signal 104. This decreases the average charge stored by the capacitor 110, and hence decreases the average voltage across the capacitor 110. The average voltage of the feedback signal on line 130 thus decreases, which in turn slows the delay cell 80, and increases the duration $T_L$ of the LOW state of the delayed clock signal 104 toward the selected duration $T_D$ of delay selected by delay control signal 50.

Similarly, in response to the duration $T_L$ being greater than the selected duration $T_D$ of delay, the current source 160B is turned ON for less than $T-T_D$. Consequently, the total charge supplied to capacitor 110 by current source 160A will be greater than the total charge drawn from the capacitor 110 by the current source 160B during a cycle of the delayed clock signal 104. This increases the average charge stored by the capacitor 110, and hence increases the average voltage across the capacitor 110. The average voltage of the feedback signal on line 130 thus increases, which speeds up the delay cell 80, and decreases the duration $T_L$ of the LOW state of the delayed clock signal 104 toward $T_D$. Thus, the delay element 20 of FIG. 4 has a stable equilibrium state of operation in which the duration $T_L$ of the LOW state of the delayed clock signal 104 equals the selected duration $T_D$ of delay specified by the delay control signal 50.

In these relationships, $I_a$ and $I_b$ are dependent upon the design and fabrication of each of the current sources 160A, 160B, including any variations in fabrication occurring during manufacture. $I_a$ and $I_b$ can be dependent upon variations in operating conditions, including variations in the temperature of the to current sources 160A, 160B, and in the voltage supplied by the high supply voltage $V_{DD}$. The current sources 160A and 160B are preferably substantially identical to simplify the determination of $T_D$ from Y. In particular, the parameters $I_a$ and $I_b$ are selected to be substantially equal, and dependence of the delay $T_D$ on these parameters cancels out. Thus:

$$T_D=(1-(Y\times I_a/I_b))\times T\qquad (Eq.\ 2)$$

reduces to $$T_D=(1-Y)\times T.\qquad (Eq.\ 8)$$

Further, the dependence of each current source 160A, 160B on variations in fabrication and operating conditions are reflected in $I_a$ and $I_b$. Thus, the delay $T_D$ will be substantially independent of any such variations if the current sources 160A, 160B are fabricated substantially identically.

Figure 7B:
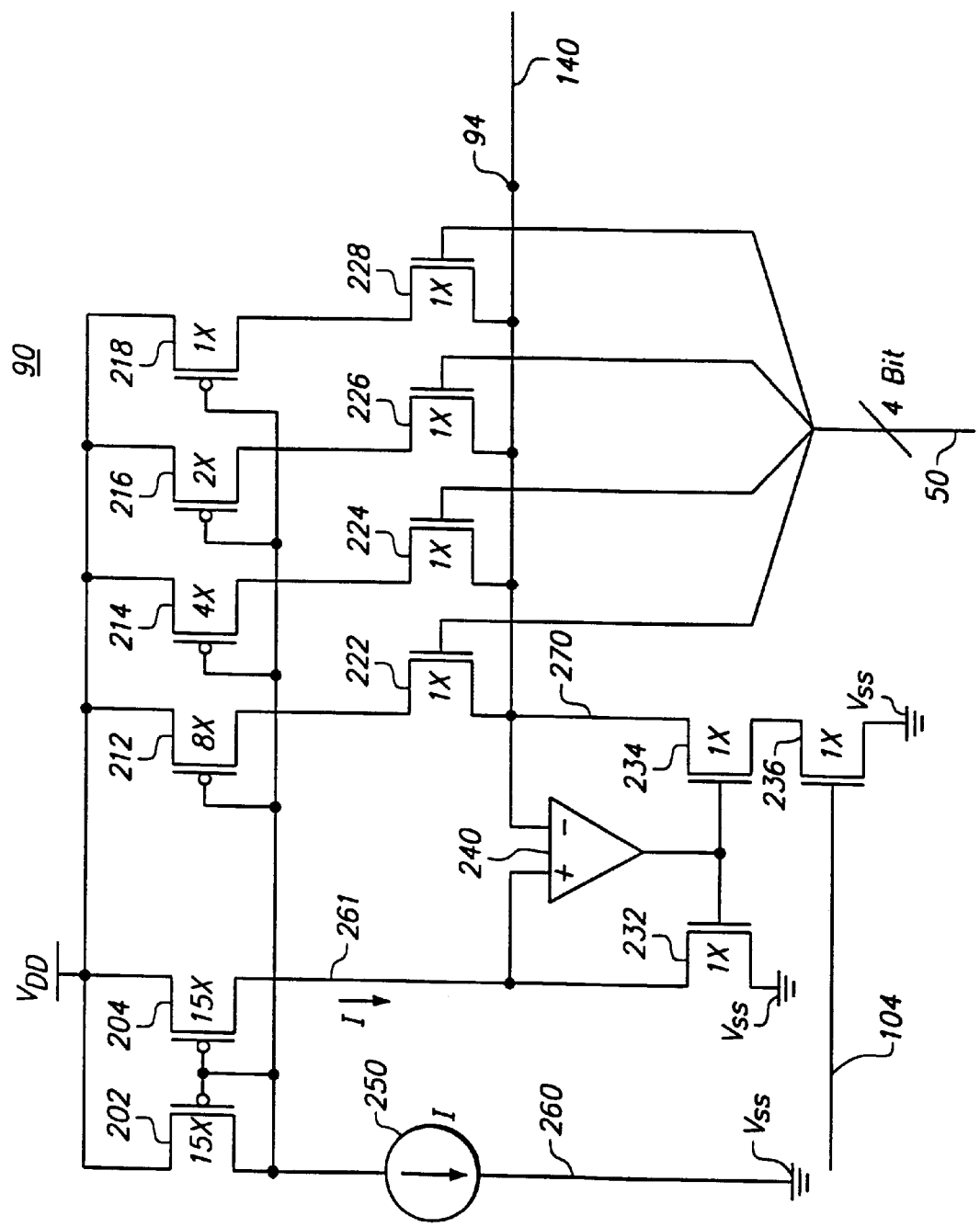
FIG. 7B is a schematic diagram of an embodiment of a charge pump of the present invention which uses a 4-bit delay control signal.

Referring now to FIG. 7B, there is shown a schematic diagram of an embodiment of the charge pump 90 which responds to 4-bit delay control signals on line 50. Charge pump 90 includes a plurality of PFETs 202, 204, 212, 214, 216, 218, having sources coupled in common to the high supply voltage $V_{DD}$. The gates of PFETs 202, 204 are both coupled to the drain of the PFET 202, and through source 250 of constant current I to ground ($V_{SS}$). The drain of the PFET 204 is coupled by line 261 to the drain of the NFET 232, and the source of this NFET 232 is coupled to ground voltage ($V_{SS}$). The PFETs 202, 204 have substantially the same channel width-to-length ratio of about 15X, and configuration of elements and appropriate biasing of the gate of the NFET 232 yields a conventional current mirror circuit that establishes current I also in line 261 to ground ($V_{SS}$).

The source and gate of each remaining PFET 212, 214, 216, 218 are coupled to the source and gate respectively of the PFETs 202, 204, and the drains of these PFETs 212, 214, 216, 218 are coupled to the drains of NFETs 222, 224, 226, 228 respectively, the sources of which are coupled to the output port 94 of the charge-pump 90 that supplies charge and discharge currents to capacitor 110. The gate of each of NFETs 222, 224, 226, 228 is coupled to respective ones of four one-bit lines comprising the 4-bit line 50 which supplies the delay control signal. Of course, these NFET switches may also be implemented in PMOS or CMOS devices The PFETs 212, 214, 216, 218 have channel width-to-length ratios of 8X, 4X, 2X, and 1X, respectively. Each PFET 212, 214, 216, 218 thus supplies essentially no current on line 140 while the corresponding NFET 222, 224, 226, 228 is turned OFF. However, while the corresponding NFET 222, 224, 226, 228 is turned ON, each PFET 212, 214, 216, 218 provides an additional current 'mirrored' with respect to line 261 as a fraction of the current I on line 261. This fraction is determined by the ratio of the channel width-to-length ratios of the PFET 212, 214, 216, 216, respectively, to the channel width-to-length ratio of the PFET 204. Thus, when NFET 224 is turned ON, the current supplied by PFET 214 is given by (4/15)×I. The given selection of channel width-to-length ratios thus allows any integral multiple of the current I/15 between 1×(I/15) and 15×(I/15) to be supplied on line 140 as the sum of the currents supplied by each of the PFETs 212, 214, 216, 218. This total current $I_A$ can be represented as Y×I where Y=N/15 and N is an integer between 1 and 15 inclusive, and where Y is as described with respect to the charge-pump 90 of FIG. 7A.

Referring, then, to the previous description, the current $I_A$=Y×I is supplied at all times. During the LOW state of the delayed clock signal 104, this current $I_A$ is the charging current $I_{CHARGE}$ to capacitor 110. Thereafter, the charge-pump 90 draws discharging current $I_{DISCHARGE}$ of amplitude (1−Y)×I from the capacitor 110, as controlled by the PFETs 212, 214, 216, 218 and the NFETs 234. Specifically, the drain of the NFET 234 is coupled by line 270 to the port 94 and line 140 from the charge-pump 90 to capacitor 110, and the source of NFET 234 is coupled through the source-drain channel of the NFET 236 to ground ($V_{SS}$). The gate of the NFET 234 and the gate of NFET 232 are coupled together to receive appropriate biasing via amplifier 240, as described in greater detail below.

The delayed clock signal on line 104 is coupled to the gate of the NFET 236 which thus functions as a conventional binary switch. The LOW state of the delayed clock signal turns OFF the NFET 236, causing the source of the NFET 234 to float, yielding zero current flow in line 270. Consequently, the current $I_A$=Y×I is supplied by selected ones of the PFETs 212, 214, 216, 218 via line 140 to charge the capacitor 110.

The HIGH state of the delayed clock signal turns ON the NFET 236 to form a current mirror between line 270 and line 261, and yielding a current $I_B$ equal to current I on line 270 to ground ($V_{SS}$). Consequently, the current $I_{DISCHARGE}$ drawn by the charge-pump 90 from capacitor 110 equals the current $I_B$=I less the current $I_A$=Y×I. That is, $I_{DISCHARGE}$= (1−Y)×I.

One scheme for biasing the gates of the NFETs 234, 232 includes directly coupling the line 261 to both of these gates. However, in the embodiment of the charge-pump 90 illustrated in FIG. 7B, operational amplifier 240 supplies the appropriate biasing and beneficially equalizes the voltage levels on lines 261 and 270. This helps to maintain precise current mirror conditions between lines 261, 270 for improved accuracy of operation of the charge pump 90.

Figure 7C:
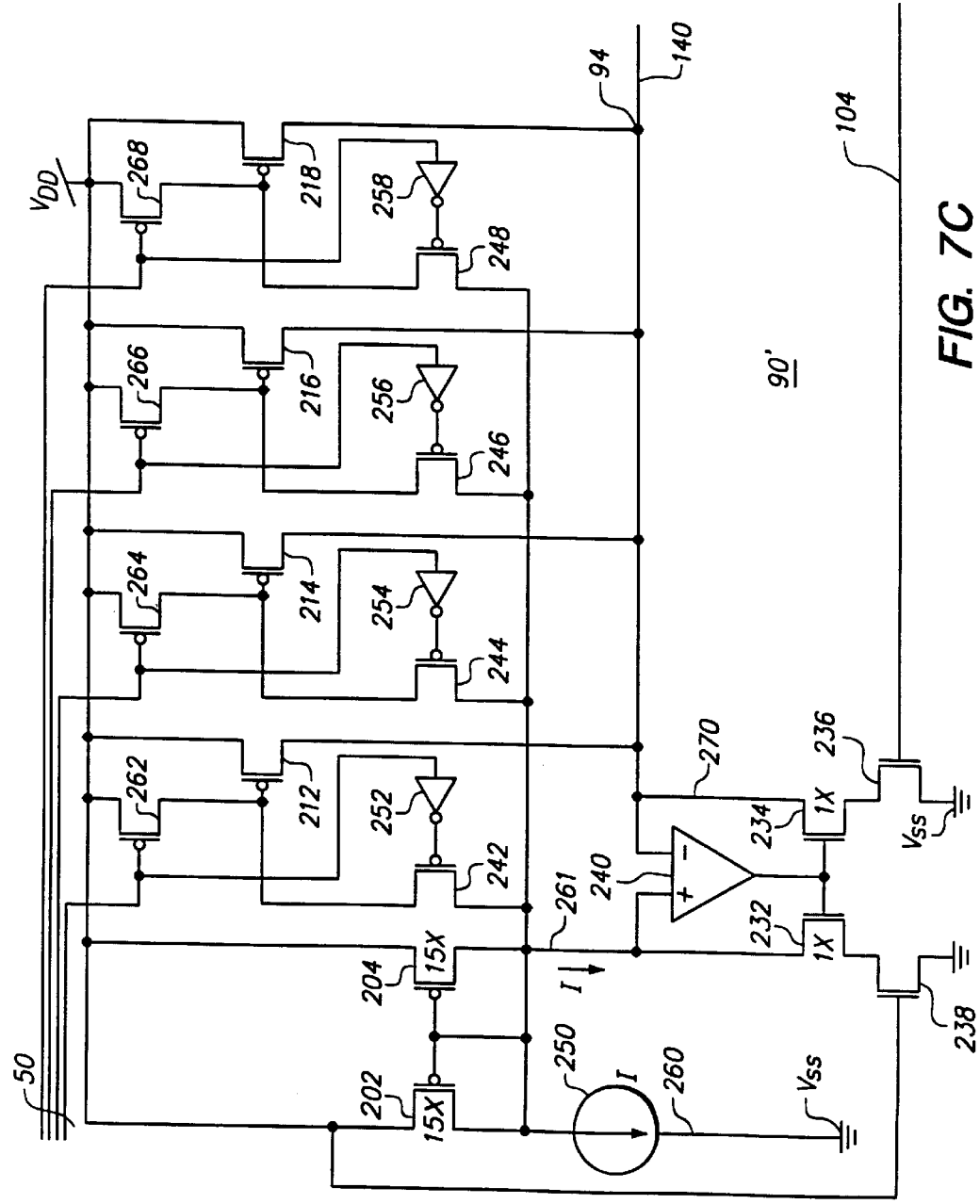
FIG. 7C is a schematic diagram of an alternate embodiment of a charge pump of the present invention.

Referring now to FIG. 7C, there is shown an alternative embodiment of a charge pump 90' of the present invention in which each of the N-bit controlled PFET and NFET circuits connected between $V_{DD}$ and the charging line 140 at port 94 are replaced by N-bit controlled circuits including PFETs 242, 244, 246, 248, 262, 265, 266, 268, a plurality of inverters 252, 254, 256, 258, and an additional NFET 238.

In the embodiment of the charge pump 90 illustrated in FIG. 7B, the currents supplied by the PFETs 212, 214, 216, 218 are turned ON and OFF at the drains thereof using the NFETs 222, 224, 226, 228. However, in the embodiment illustrated in FIG. 7C, these NFETs 222, 224, 226, 228 are omitted, and the drain of each of these PFETs 212, 214, 216, 218 is coupled to the charging line 104 at port 94 of the charge pump 90'. The currents supplied by these PFETs 212, 214, 216, 218 are turned ON and OFF at the gates under control of the additional PFETs 242, 244, 246, 248, 262, 264, 266, 268 and the inverters 252, 254, 256, 258.

The input of each inverter 252, 254, 256, 258 is coupled to the gate of the additional PFETs 262, 264, 266, 268, respectively, and further to a 1-bit line of the 4-bit line 50 that supplies the delay control signal. The output of each inverter 252, 254, 256, 258 is coupled to the gate of the additional PFET 242, 244, 246, 248, respectively. The drains of all of PFETs 242, 244, 246, 248 are coupled to the gates of both PFETs 202, 204. The source of each PFET 242, 244, 246, 248 is coupled to the gate of PFET 212, 214, 216, 218, respectively, and to the drain of the PFET 262, 264, 266, 268, respectively. The sources of all of PFETs 262, 264, 266, 268 are coupled to high supply voltage $V_{DD}$.

To turn ON the PFET 212, a HIGH signal is supplied on the 1-bit line coupled to the gate of the PFET 262 and to the input of the inverter 252. The HIGH signal turns OFF the PFET 262. However, the inverter 252 supplies a LOW signal which turns ON the PFET 242. The voltage on the gates on the PFETs 202, 204 is thus supplied via the additional PFET 242 to the gate of the PFET 212.

To turn OFF the PFET 212, a LOW signal is supplied on the same 1-bit line. This turns ON the PFET 262, and the drain thus supplies a HIGH signal on the gate of the PFET 212, which turns OFF the PFET 212. Further, the LOW signal on the 1-bit line causes the additional inverter 252 to turn OFF the PFET 242. The other PFETs 214, 216, 218 are similarly turned ON or OFF.

The source of NFET 238 is coupled to ground ($V_{SS}$), the drain is coupled to the source of the NFET 232, and the gate of NFET 238 is coupled to the high supply voltage $V_{DD}$. This NFET 238 balances the NFET 236, for improved current mirror conditions. NFET 232 and NFET 234 will have the identical current if:

the width of NFET 232=the width of NFET 236;
the length of NFET 232=the length of NFET 236;
$V_{GS}$ of NFET 232=$V_{GS}$ of NFET 236; and
$V_{DS}$ of NFET 232=$V_{DS}$ of NFET 236.

By selecting identical device sizes for both NFETS 232 and 236, the first and second requirements are met. In order to meet $V_{GS}$ requirements, NFET 238 needs to be added to provide identical voltage drop. The source of NFET 238 is coupled to ground ($V_{SS}$), the drain is coupled to the source of the NFET 232, and the gate of NFET 238 is coupled to the high supply voltage $V_{DD}$. This NFET 238 balances the NFET 236, for improved current mirror conditions. An operational amplifier 240 connected as shown assures that $V_{DS}$ of NFET 232 and 234 are identical.

The delay control signal 50 is a N-bit control line controls the duty cycle of the delay element. By assigning a different control value for each of the delay elements 17–20 shown in FIG. 1, the rising edges of the delayed clock signals CK0, CK1, CK2, and CK3 will occur at different times. Considering the embodiment of a charge pump 90 as shown in FIG. 7B:

DLY_CTRL0=1010 → $Y_0$=10/15
DLY_CTRL1=1001 → $Y_1$=9/15
DLY_CTRL2=1000 → $Y_2$=8/15
DLY_CTRL3=0111 → $Y_3$=7/15

Figure 8:
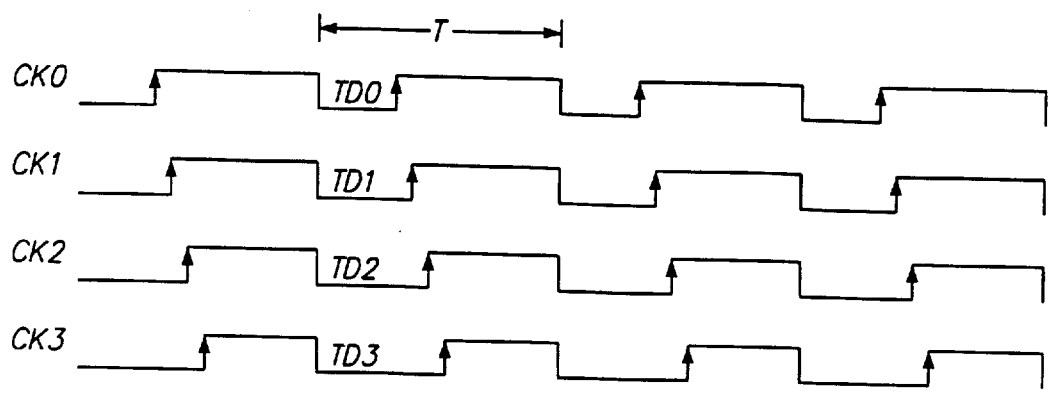
FIG. 8 is a clock waveform of different programmed delays for the delay elements in FIG. 1.

Using Eq. 8, gives us $T_{D0}$, $T_{D1}$, $T_{D2}$, $T_{D3}$=5/15×T, 6/15×T, 7/15×T, 8/15×T respectively, as shown in FIG. 8. The differential delays between two clocks is therefore equal to $T_{Di}$−$T_{Dj}$. The resulting $NRZ_i$ will be a delayed version of $NRZ_j$ by the same amount. In this example, the difference in delay is 1/15×T=6.6%×T.

The present invention therefore provides high performance selectable delay of a clock signal by employing a plurality of high-performance delay elements that each provides a very stable, selectable delay of a clock signal despite variations in fabrication or operating conditions. The delayed clock signal in turn facilitates convenient conversion of NRZI signals to NRZ signals for write precompensation of digital signals to be written to magnetic storage medium.

We claim:

1. A circuit for supplying a selected duration of delay with respect to transitions of a clock signal between first and second states thereof, the circuit comprising:

a delay cell having inputs connected to receive the clock signal and a feedback signal for supplying an output signal having a third state that is selectively delayed in transition to a fourth state with respect to transitions of the clock signal from the first state to the second state in response to an applied feedback signal; and a control circuit connected to receive the third signal and a control signal for specifying the selected delay to supply a feedback signal to the delay cell for altering said selective delay in transition.

2. The circuit of claim 1 wherein the delay cell decreases the duration of delay in response to an increase in the magnitude of the feedback signal.

3. The circuit of claim 1 wherein the delay cell increases the duration of delay in response to an increase in the magnitude of the feedback signal.

4. The circuit of claim 1 wherein the control signal is applied to the control circuit in digital form representing a number Y inclusively between zero and one, and the control circuit further comprises:

a capacitor connected to receive current from a first current source for continuously supplying a first current of amplitude Y×I to charge the capacitor at one rate during a selected interval of the output signal, and connected to receive current from a second current source for drawing a second current of amplitude I from the capacitor during another interval of the output signal for discharging the capacitor at another rate during a successive interval of the output signal.

5. The circuit of claim 4 wherein an output signal of low magnitude is representative of the selected interval, and an output signal of high magnitude is representative of the successive interval, and the one charging rate of the capacitor is determined by Y×I, and said another rate of discharging the capacitor is determined by (1−Y)×I.

6. The circuit of claim 1, further comprising a flip-flop circuit having a data input connected to receive a digital signal synchronized with the clock signal, having a clock input connected to receiving the output signal from the delay cell and triggered by transitions from the third state to the fourth state thereof, and having an output connected to supply a delayed digital signal that is delayed by said selective delay with respect to the digital signal.

7. The circuit according to claim 1, wherein said delay cell comprises a first stage and a second stage.

8. The circuit according to claim 7, wherein said first stage comprises:

an odd number of inverters each having an output port in communication with a succeeding input port, with an input port of an initial one of said cascaded inverters to receive the clock signal, and a NAND gate having a first input port coupled to receive the clock signal at the input port of said initial one of said cascaded inverters, having a second input port coupled to an output port of a last one of said cascaded inverter, and having an output port for supplying an altered clock signal having a longer duty cycle than the clock signal to said second state.

9. The circuit according to claim 7, wherein said first stage comprises an output port for supplying an altered clock signal having a longer duty cycle than the clock signal supplied to the input port of said first stage.

10. A method for operating on clock signals transitioning between first and second states for supplying a delayed clock signal having a third state that is selectively delayed in transition to a fourth state by the method comprising:

generating the delayed clock signal having transitions between the third and fourth states delayed with respect to state transitions of the clock signal between the first and second states in response to a feedback signal; and receiving a control signal indicating a selected duration of delay in transition between the third and fourth states for supplying the feedback signal representative of the selected duration of delay indicated by the received control signal.

11. The method of claim 10, further comprising:

receiving a digital signal synchronized with the clock signal; and supplying a delayed digital signal having state transitions delayed by a second duration of delay with respect to the state transitions of applied signal.

12. A circuit for supplying a selected duration of delay with respect to transitions of a clock signal between first and second states thereof, the circuit comprising:

delay means for receiving the clock signal and a feedback signal for supplying an output signal having a third state that is selectively delayed in response to an applied feedback signal in transitioning to a fourth state with respect to transitions of the clock signal from the first state to the second state; and control means for receiving the third signal and a control signal for specifying the selected delay to supply said feedback signal for altering said selective delay in transition.

13. The circuit of claim 12 wherein said delay means decreases the duration of delay in response to an increase in the magnitude of the feedback signal.

14. The circuit of claim 12 wherein said delay means increases the duration of delay in response to an increase in the magnitude of the feedback signal.

15. The circuit of claim 12 wherein the control signal is applied to the control means in digital form representing a number Y inclusively between zero and one, and the control means further comprises:

means for continuously supplying to a capacitor a first current of amplitude Y×I to charge the capacitor at one rate during a selected interval of the output signal, and for drawing from the capacitor a second current of amplitude I during another interval of the output signal for discharging the capacitor at another rate during a successive interval of the output signal.

16. The circuit of claim 15 wherein an output signal of low magnitude is representative of the selected interval, and an output signal of high magnitude is representative of the successive interval, and the one charging rate of the capacitor is determined by Y×I, and said another rate of discharging the capacitor is determined by (1−Y)×I.

17. The circuit of claim 12, further comprising means for receiving a digital signal synchronized with the clock signal, and for receiving the output signal from the delay means for responding to transitions from the third state to the fourth state to supply a delayed digital signal that is delayed by said selective delay with respect to the digital signal.

18. Apparatus for providing write precompensation for a data storage device, comprising:
- a plurality of the circuits of claim 17, each disposed to receive a digital signal for data storage, and each connected to receive a control signal specifying different durations of delay; and
- multiplexer means coupled to said plurality of circuits for receiving signals therefrom and having a selection port for controlling selection of the signals from said circuits for supplying the fourth signal corresponding to a selected signal from one of said plurality of circuits.

19. A circuit for providing write precompensation for a data storage device, the circuit comprising:
- a plurality of the circuits of claim 6, each disposed to receive a digital signal for data storage, and each connected to receive a control signal specifying different durations of delay; and
- a multiplexer having a plurality of input ports, each coupled to said output signal of a distinct one of the circuits of claim 6 for receiving a distinct one of a plurality of fourth signals therefrom, the multiplexer having a selection port for receiving a selection signal to control selection of one of the input ports thereof, and having an output for supplying the fourth signal corresponding to said one of the input ports.

\* \* \* \* \*